US009624600B2

(12) United States Patent
Kelber

(10) Patent No.: US 9,624,600 B2
(45) Date of Patent: Apr. 18, 2017

(54) DIRECT GRAPHENE GROWTH ON METAL OXIDES BY MOLECULAR EPITAXY

(71) Applicant: University of North Texas, Denton, TX (US)

(72) Inventor: Jeffry A. Kelber, Denton, TX (US)

(73) Assignee: UNIVERSITY OF NORTH TEXAS, Denton, TX (US)

( * ) Notice: Subject to any disclaimer, the term of this patent is extended or adjusted under 35 U.S.C. 154(b) by 0 days.

(21) Appl. No.: 14/362,619

(22) PCT Filed: Dec. 6, 2012

(86) PCT No.: PCT/US2012/068066
§ 371 (c)(1),
(2) Date: Jun. 4, 2014

(87) PCT Pub. No.: WO2013/086068
PCT Pub. Date: Jun. 13, 2013

(65) Prior Publication Data
US 2014/0332915 A1     Nov. 13, 2014

Related U.S. Application Data

(60) Provisional application No. 61/567,344, filed on Dec. 6, 2011.

(51) Int. Cl.
*H01L 21/02*     (2006.01)
*H01L 29/82*     (2006.01)
(Continued)

(52) U.S. Cl.
CPC ............ *C30B 23/025* (2013.01); *B82Y 30/00* (2013.01); *B82Y 40/00* (2013.01);
(Continued)

(58) Field of Classification Search
CPC ........... H01L 29/1606; H01L 21/02381; H01L 21/02488; H01L 21/02527; H01L 21/0242;
(Continued)

(56) References Cited

U.S. PATENT DOCUMENTS 6,582,972 B1 *   6/2003   Joshi et al. ....................... 438/3
8,748,957 B2     6/2014   Kelber et al.
(Continued)

FOREIGN PATENT DOCUMENTS

WO    WO 2011/021715 A1    2/2011
WO    WO 2011021715 A1 *   2/2011

OTHER PUBLICATIONS

Hindmarch et al., Room temperature magnetic stabilization of buried cobalt nanoclusters circular dichroism, 2008, American Institute of Physics, Appl. Phys. Lett, 93, pp. 172511-(1-3).*
(Continued)

*Primary Examiner* — Natalia Gondarenko
(74) *Attorney, Agent, or Firm* — The Kelber Law Group

(57) ABSTRACT

Direct growth of graphene on $Co_3O_4(111)$ at 1000 K was achieved by molecular beam epitaxy from a graphite source. Auger spectroscopy shows a characteristic $sp^2$ carbon lineshape, at average carbon coverages from 0.4-3 monolayers. Low energy electron diffraction (LEED) indicates (111) ordering of the $sp^2$ carbon film with a lattice constant of 2.5 (±0.1) Å characteristic of graphene. Six-fold symmetry of the graphene diffraction spots is observed at 0.4, 1 and 3 monolayers. The LEED data also indicate an average domain size of ~1800 Å, and show an incommensurate interface with the $Co_3O_4(111)$ substrate, where the latter exhibits a lattice constant of 2.8 (±0.1) Å. Core level photoemission shows a characteristically asymmetric C(1s) feature, with the expected lr to lr* satellite feature, but with
(Continued)

a binding energy for the three monolayer film of 284.9 (±0.1) eV, indicative of substantial graphene-to-oxide charge transfer.

3 Claims, 8 Drawing Sheets

(51) Int. Cl.
    *C30B 23/02*       (2006.01)
    *H01L 29/16*      (2006.01)
    *H01F 41/32*      (2006.01)
    *C30B 29/02*       (2006.01)
    *C01B 31/04*       (2006.01)
    *B82Y 30/00*       (2011.01)
    *B82Y 40/00*       (2011.01)
    *C30B 23/06*       (2006.01)
    *H01L 29/66*      (2006.01)

(52) U.S. Cl.
    CPC .......... *C01B 31/0461* (2013.01); *C30B 23/02* (2013.01); *C30B 23/066* (2013.01); *C30B 29/02* (2013.01); *H01F 41/32* (2013.01); *H01L 21/02381* (2013.01); *H01L 21/02395* (2013.01); *H01L 21/02488* (2013.01); *H01L 21/02527* (2013.01); *H01L 21/02658* (2013.01); *H01L 29/1606* (2013.01); *H01L 29/82* (2013.01)

(58) Field of Classification Search
    CPC ......... H01L 21/02433; H01L 21/02516; H01L 21/02631; H01L 21/0223; H01L 21/02244; H01L 21/02255; H01L 21/02395; H01L 21/02658; H01L 21/31; H01L 21/20; H01L 29/02; H01L 29/82; H01L 29/66015; H01L 23/62; C30B 23/02; C30B 23/025; C30B 23/066; C30B 29/02; B82Y 40/00; B82Y 30/00; H01F 41/32; C01B 31/046; C01B 31/0461; C01B 31/0438; C01B 2204/02
    USPC ................ 257/347, 421, 422, 9; 438/3, 151; 117/94, 108, 106; 427/528; 423/448; 977/734

See application file for complete search history.

(56) References Cited

U.S. PATENT DOCUMENTS

| | | | | |
|---|---|---|---|---|
| 2004/0157473 | A1* | 8/2004 | Hayashi | H01L 21/28202 438/785 |
| 2006/0018057 | A1* | 1/2006 | Huai | 360/324.2 |
| 2006/0291105 | A1* | 12/2006 | Chang et al. | 360/324.2 |
| 2009/0079040 | A1* | 3/2009 | Schultz | H01L 21/02381 257/632 |
| 2010/0109712 | A1* | 5/2010 | Zaliznyak et al. | 327/100 |
| 2011/0089403 | A1* | 4/2011 | Woo et al. | 257/29 |
| 2011/0121409 | A1* | 5/2011 | Seo et al. | 257/410 |
| 2012/0161098 | A1* | 6/2012 | Hiura et al. | 257/9 |
| 2014/0212671 | A1* | 7/2014 | Kelber | 428/408 |

OTHER PUBLICATIONS

Novoselov, et al., "Electric Field Effect in Atomically Thin Carbon Films", Science, vol. 306, Oct. 22, 2004, pp. 666-669.
Novoselov, et al., "Two-Dimensional Gas of Massless Dirac Fermions in Graphene", Nature, vol. 438, Nov. 10, 2005, pp. 197-200.
Neto, et al., "The Electronic Properties of Graphene", Rev. Mod. Phys., vol. 81, No. 1, Jan.-Mar. 2009.
Haugen, et al., "Spin Transport in Proximity-Induced Ferromagnetic Graphene", Physical Review, B 77, 115406 (2008).
Tombros, et al., "Electronic Spin Transport and Spin Precession in Single Graphene Layers at Room Temperature", Nature, vol. 448, Aug. 2, 2007, pp. 571-574.
Li, et al., Large-Area Synthesis of High-Quality and Uniform Graphene Films on Copper Foils, Science, vol. 324, Jun. 5, 2009, pp. 1312-1314.
Reina, et al., "Growth of Large-Area Single-and Bi-Layer Graphene by Controlled Carbon Precipitation on Polycrystalline Ni Surfaces", Nano Res. (2009) 2:509-516.
Berger, et al., "Ultrathin Epitaxial Graphite: 2D Electron Gas Properties and a Route Toward Graphene-Based Nanoelectronics", J. Phys. Chem. B 2004, 108, 19912-19916.
Berger, et al., "Electronic Confinement and Coherence in Patterned Epitaxial Graphene", Science, vol. 312, May 26, 2006, pp. 1191-1196.
Forbeaux, et al., "Heteroepitaxial Graphite on 6H-SiC(0001): Interface Formation Through Condction-Band Electronic Structure", Physical Review B, vol. 58, No. 24, Dec. 15, 1998.
Zhang, et al., "Oigin of Spatial Charge Inhomogeneity in Graphene", Nature Physica, vol. 5, Oct. 2009, pp. 722-726.
Park, et al., "Epitaxial Graphene Growth by Carbon MOlecular Beam Epitaxy (CMBE)", Adv. Mater 2010, 22, 4140-4145.
Moreau, et al., "Graphene Growth by Molecular Beam Epitaxy Using a Solid Carbon Source", PHys. Status Solidi A. 207, No. 2, 300-303 (2010).
Zheng, et al., "Gate-Controlled Nonvolatile Graphene-Ferroelectric Memory", Applied Physics Letters 94, 163505 (2009).
Imam, et al., "Charge Transfer Hysteresis in Graphene Dual-Dielectric Memory Cell Structures", Applied Physics Letters 99, 082109 (2011).
Michetti, et al., "Electric Field Control of Spin Rotation in Bilayer Graphene", Nano. Lett. 2010, 10, 4463-4469.
Bjelkevig, et al., "Electronic Structure of a Graphene/Hexagonal-BN Heterostructure Grown on Ru(0001) . . . ", J. Phys.: Condens, Matter 22 (2010), pp. 1-6.
Gaddam, et al., "Direct Graphene Growth on MgO: Origin of the Band Gap", J. Phys.: Codens. Matter 23 (2011), pp. 1-4.
Kelber, et al., "Direct Graphene Growth on MgO(111) by Physical Vapor Deposition . . . ", Proc. of SPIE vol. 8100.
Kong, et al., "Graphene/Substrate Charge Transfer Characterized by Inverse Photoelectron Spectroscopy", J. Phys. Chem. C 2010, 114, 21618-21624.
Fanton, et al., "Catalytic-Free Synthesis of High Mobility Graphene on Sapphire", The Pennsylvania State University, Contribution (Oral).
Bjelkevig, et al., "Stability of Iodine on Ruthenium During Copper Electrodeposition . . . ", Electrochimica Acta 54 (2009) 3892-3898.
Hoffmann, et al., "Hole-Channel Conductivity in Epitaxial Graphene Determined . . . ", Applied Physics Letters 98, 041906 (2011).
Donders, et al., "Remote Plasma Atomic Layer Deposition of Co3O4 Thin Films", Journal of the Electrochemical Society, 158 (4) G92-G96, (2011).
Vaz, et al., "Experimental Study of the Interfacial Cobalt Oxide in . . . ", PHysical Review B 80, 155457 (2009).
Dedkov, et al., "Rashba Effect in the Graphene/Ni(111) System", Physical Review Letters 100, 107602 (2008).
Chambers, et al., "Laminar Growth of Ultrathin Metal Films on Metal Oxides: Co on . . . ", Science, vol. 297, Aug. 2, 2002, pp. 827-831.
Emtsev, et al., "Interaction, Growth, and Ordering of Epitaxial Graphene on SiC (0001) Surfaces . . . ", Physical Review B 77, 155303 (2008).
Santoso, et al., "Observation of Room-Temperature High-Energy Resonant Excitonic Effects in Graphene", Physical Review B 84, 081403(R)(2011).
Kravets, et al., "Spectroscopic Ellipsometry of Graphene and an Exciton-Shifted . . . ", Physical Review B 81, 155413 (2010).
Lazarov, et al., "Structure of the Hydrogen-Stabilized MgO(111)-(1X1) Polar Surface: Integrated . . . ", Physical Review B 71, 115434 (2005).

(56) References Cited

OTHER PUBLICATIONS

Goniakowski, et al., "Microscopic Mechanisms of Stabilization of Polar Oxide Surfaces: Transition Metals . . . ", Physical Review B 66, 085417 (2002).
Hindmarch, et al., "Room Temperature Magnetic Stabilization of Buried Cobalt Nanoclusters . . . ", Applied PHysics Letters 93, 172511 (2008).

\* cited by examiner

Form a layer of
metal with a major
surface on a
substrate

Anneal the major surface of
metal in oxygen to form a
metal oxide layer on the
major surface major surface Form more than one layer of
macroscopically continuous
graphene on the metal oxide
by MBE

DIRECT GRAPHENE GROWTH ON METAL OXIDES BY MOLECULAR EPITAXY

PRIORITY DATA AND INCORPORATION BY REFERENCE

This application claims benefit of priority to U.S. Provisional Patent Application No. 61/567,344 filed Dec. 6, 2011 which is incorporated by reference in its entirety.

BACKGROUND OF THE INVENTION

This work was partially supported by the Semiconductor Research Corporation, Division of Nanomanufacturing Sciences, Task ID 2123.001. Support from the National Science Foundation through grants DMR-0907475 and MRI DMR-0922937 is hereby acknowledged.

FIELD OF THE INVENTION

This invention pertains to the controlled, layer-by-layer growth of graphene on a useful, magnetizable/and or insulating substrate using molecular beam epitaxy (MBE). The graphene layers are macroscopically continuous single- and multiple layer graphene films formed at moderate temperatures directly on the substrate formed on top of a room temperature ferromagnet. This application is related in part to U.S. patent application Ser. No. 13/343,970 (hereinafter the "'970 application"). The '970 application, incorporated herein by reference, is directed to coherent spin field effect transistors. The methods and compositions provided by this application may be used in the preparation of the coherent spin FETs.

Graphene displays electronic properties, including high room temperature carrier mobilities, long carrier mean free paths [1-3], polarizeability in proximity to a magnetic substrate [4] and long spin diffusion lengths [5], with exciting potential for charge or spin-based device applications. A critical step in practical device development, however, is the direct, controlled growth, by industrially feasible and scalable methods, of high quality single or few layer graphene films on dielectric substrates. Methods such as chemical or physical vapor deposition or molecular beam epitaxy (MBE) are of interest, but must occur at growth temperatures allowing integration with Si CMOS or other device materials. Most reports, however, have involved graphene/substrate interfaces formed by one of two approaches: (a) physical transfer of graphene sheets—grown by chemical vapor deposition on metal substrates [6, 7] or taken from HOPG [1, 2]; or (b) the growth of graphene layers by high temperature evaporation of Si from SiC(0001) [8-10]. The former method presents significant problems for practical device production, including formation of nanoscale interfacial electronic inhomogeneities [11]. The second method appears limited to SiC(0001) substrates. Recent reports of MBE graphene growth on SiC(0001) [12, 13] are also limited to SiC substrates.

The ability to grow single or few layer graphene on oxides (such as cobalt oxide, chromia, alumina, magnesium oxide, nickel oxide and other metal oxides) or other dielectric substrates of choice would not only enhance graphene integration with Si CMOS, but also facilitate the development of novel non-volatile devices [14-16] that exploit substrate functionality and graphene/substrate interactions.

SUMMARY OF THE INVENTION

In summary, Auger (FIG. 1), LEED (FIGS. 2 and 3), XPS (FIG. 4), and spectroscopic ellipsometry data (FIG. 5) demonstrate the layer-by-layer growth of macroscopically continuous graphene films, up to at least 3 ML thickness, on $Co_3O_4(111)/Co(0001)$ at 1000 K by MBE from a graphite rod source. LEED data also indicate a domain size of ~1800 Å, comparable to HOPG. Since only amorphous C is obtained by MBE on SiC below 1273 K [12, 13], the substantially lower growth temperature for ordered graphene MBE on $Co_3O_4(111)$, indicates that carbon atom interactions with the oxide surface play an important role in the initial graphene nucleation and growth. LEED data (FIG. 2) indicate that the graphene/oxide substrate is incommensurate, without significant reconstruction of the $Co_3O_4(111)$ surface, thus yielding $C_{6V}$ symmetry in the first layer, and also in the third layer (FIG. 3). This is in contrast to graphene growth on MgO(111), where the O—O nearest neighbor distance of the (1×1) surface is similar to that of $Co_3O_4(111)$ [30, 41]. For MgO(111), $C_{3V}$ LEED patterns and band gap formation strongly suggest the formation of a commensurate interface [18, 19] which removes A site/B site chemical equivalence in the graphene lattice, lifting HOMO/LUMO degeneracy at the Dirac point, and inducing a band gap. A possible explanation for the formation of a commensurate interface is that the polar surface of MgO(111), having the rocksalt structure, is prone to reconstruction [41-43], particularly upon metallization and charge transfer to the oxide [44]. In contrast, cation/anion relaxations within the outermost layer of $Co_3O_4(111)$ sharply reduce the polarity, and therefore the driving force for reconstruction [30].

Although the Auger electron spectroscopy data (FIG. 1), LEED spectra (FIGS. 2 and 3), ir to ir* features in the C(1s) XPS (FIG. 4), and spectroscopic ellipsometry data (FIG. 5) all corroborate the formation of an $sp^2$ C(111) overlayer—graphene—the C(1s) binding energy of 284.9 (±0.1) eV for the 3 ML graphene film is 0.4 eV higher than that usually observed for graphitic carbon, and indicates substantial charge transfer from the graphene layer to the substrate. The C(1s) binding energy reported for monolayer graphene on the reconstructed (6√3×6√3) R30 carbon interfacial layer of Si-terminated SiC(0001) is similarly high—284.75 (±0.1) eV [37]—but this value relaxes to ~284.5 eV by the time a graphene average thickness of 3.4 ML is observed, indicating an effective "screening length" of ~2-3 ML for graphene on Si-terminated SiC(0001). While the C(1s) binding energy reported here, 284.9 (±0.1 eV) is an average for a 3 ML film, a direct comparison between the data reported here and in the graphene/SiC study [37] is complicated by the substantially higher excitation energy and effective C(1s) sampling depth in the current study.

In any case, the ability of additional layers of graphene to screen interactions between the top graphene layer and the substrate may well differ on different substrates, and promises to be of substantial interest for device applications. In particular, the fabrication of macroscopically continuous graphene layers for graphene FETs, spin FETs, magnetic tunnel junctions and similar discrete devices and IC components that can be "tuned" by appropriate substrate selection and treatment offers a broad field of nanotech applications and devices of improved performance.

The ability to grow macroscopically continuous single- and multilayer graphene films at moderate temperatures directly on a magnetically polarizable oxide substrate formed on top of a room temperature ferromagnet suggests a number of unusual charge and spin device applications. Additionally, the growth of highly (111)-oriented $Co_3O_4$ (111) on Si(100) by plasma enhanced atomic layer deposition has recently been reported [25], suggesting a new, direct route towards graphene integration with Si CMOS.

BRIEF DESCRIPTION OF THE DRAWINGS

The accompanying drawings, which are incorporated herein and constitute part of this specification, illustrate exemplary embodiments of the invention, and, together with the general description given above and the detailed description given below, serve to explain the features of the invention.

Figure 7:
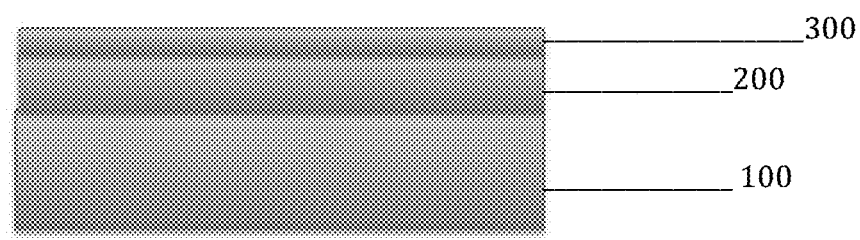
As shown in FIG. 7, practice of this process results in a device that comprises ferromagnetic layer 100, on a major surface of which is formed a layer of metal oxide 200 by annealing the ferromagnetic layer 100 in an oxygen atmosphere. On the exposed surface of the metal oxide layer 200, a film of more than one layer of macroscopically continuous graphene 300 is formed by molecular beam epitaxy.
Figure 8A:
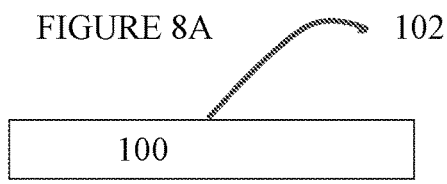
Figure 8B:
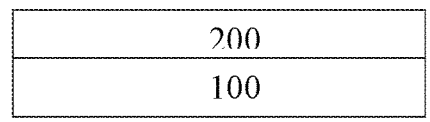
Figures 8, 8C:
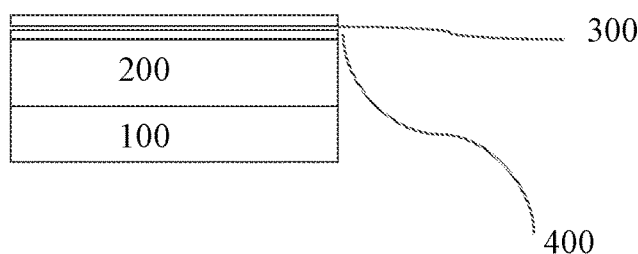

The process shown in FIG. 7 may be schematically illustrated as set forth in FIGS. 8A-8C. Thus, in FIG. 8A a layer of metal 100 having a first major surface 102 is formed as shown. In the second step of the recited process, that major surface 102 of layer 100 is annealed to form a layer of the oxide of that metal, shown in FIG. 8B as oxide layer 200. In the third step of the process used to form the device of the claims, more than one layer 300 of macroscopically continuous graphene is formed on the metal oxide layer 200. Since these layers of macroscopically continuous graphene are formed by MBE, the interface 400 between the surface of metal oxide layer 200 and the first formed macroscopically continuous layer of graphene 300 is incommensurate with no reconstruction of the surface.

DETAILED DESCRIPTION OF THE DRAWINGS

The examples of the invention can be best understood, initially, by reference to the Figures briefly described above. The descriptions set forth are applicable to the more detailed description immediately below. Wherever specific aspects of the drawings are referred to, such as 1b or 3a, the same numbers will be used throughout the drawings to refer to the same aspects.

Figure 1:
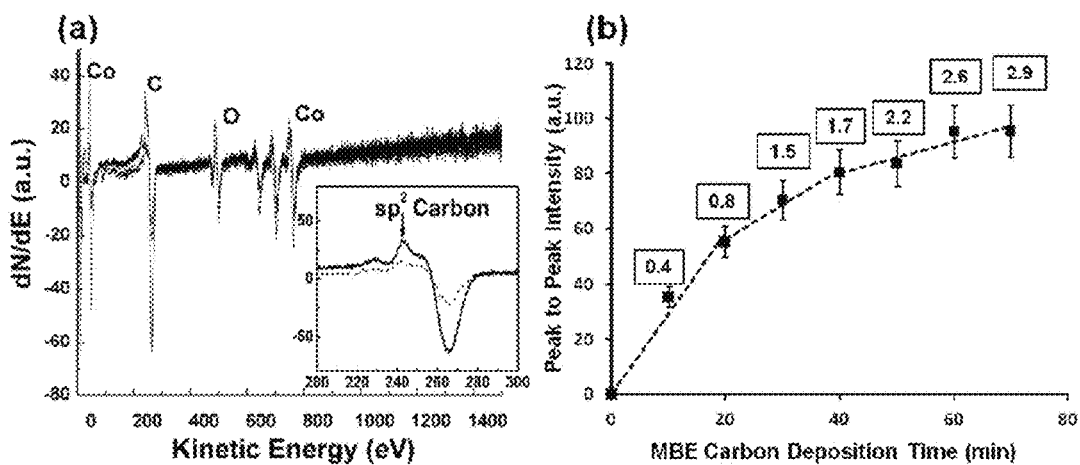
FIG. 1 is (a) Auger spectra acquired after deposition of 0.4 ML graphene (dashed line) and 3.0 ML graphene (solid line), inset—detail of C(KVV) spectral region showing characteristic $sp^2$ lineshape; (b) Growth curve showing evolution of Auger-derived average carbon overlayer thickness (number above each data point, ML) as a function of deposition time at 1000 K. Lines are least squares fits to the data.

FIG. 1 displays the Auger electron spectra (FIG. 1a) acquired after depositions corresponding to 0.4 ML (first deposition, dashed line) and 3.0 ML (last deposition, solid line). The C(KVV) spectral region of the Auger electron spectra (FIG. 1a, inset) shows line/shape characteristic of $sp^2$ carbon [28]. The "growth curve" showing the evolution of Auger spectra-determined average carbon thickness as a function of MBE deposition time, is plotted in FIG. 1b. The data are well fit by a series of straight lines, with changes in slope corresponding to completion of one monolayer and beginning of another. This is strongly suggestive evidence of layer-by-layer growth [29], consistent with the changing low energy electron diffraction intensity versus voltage curves, as discussed below. Thus, the Auger electron spectroscopy data demonstrate growth of multilayer $sp^2$ carbon films by MBE on $Co_3O_4(111)$.

Figure 2:
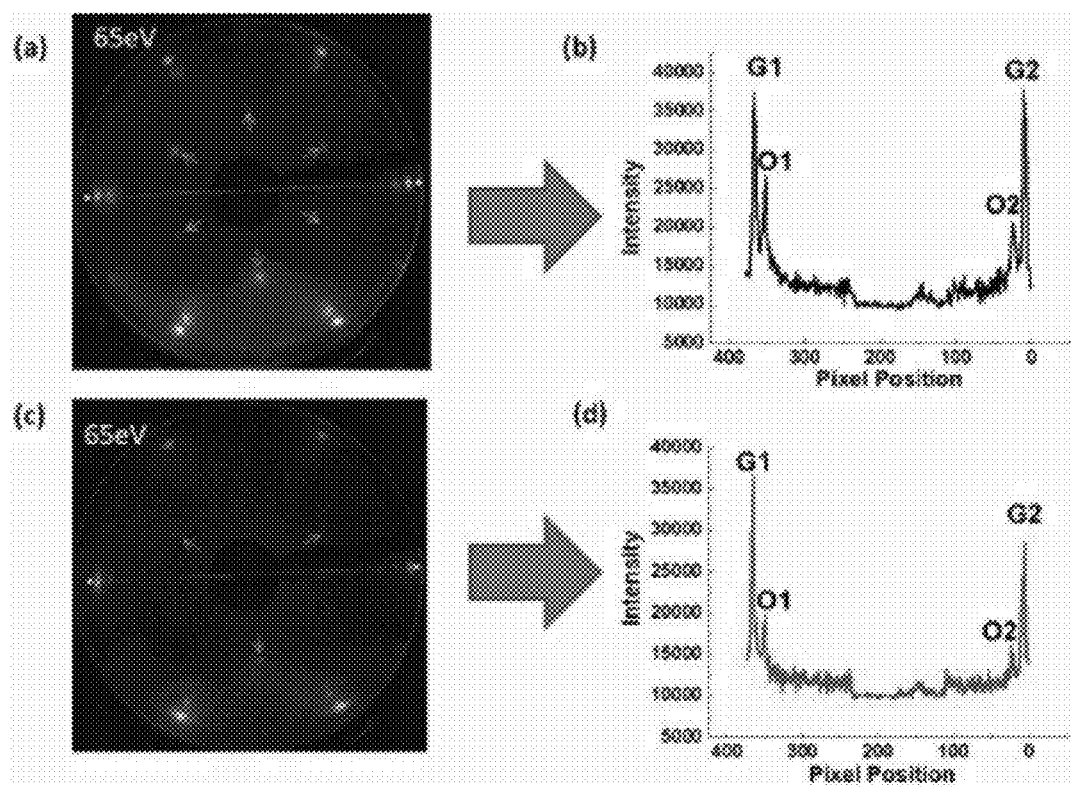
FIG. 2 is LEED and corresponding line scan data for (a,b) 0.4 ML graphene on $Co_3O_4(111)$, and (c,d) 3 ML graphene on $Co_3O_4(111)$. Arrows (a,c) mark diffraction spots associated with $Co_3O_4(111)$, as do inner spots in the outer ring of bifurcated features (e.g., O1,O2—b,d). Outer spots in the outer ring of bifurcated features (e.g., G1, G2—b,d) are graphene-related. LEED beam energy is 65 eV.

FIG. 2 shows LEED images and corresponding line scans for films of 0.4 ML (FIG. 2a,b) and 3 ML (FIG. 2c,d) average thickness. Both LEED images (FIG. 2a,c) consist of an outer six-fold array of bifurcated spots, and an inner array of spots (3 strong, 3 weak, marked by arrows, FIG. 2a) rotated 30° from the outer ring of spots. The outer spots in the bifurcated six-fold array (e.g., G1, G2—FIG. 2b,d) increase in relative intensity with increasing carbon deposition while the other spots in the bifurcated outer ring (e.g., O1,O2—FIG. 2b,d) as well as the inner ring of spots (arrows, FIG. 2a,c) decrease in intensity during this process. This identifies the outer spots in the bifurcated array as related to a six-fold $sp^2$ C(111) overlayer-graphene. The other spots are characteristic of the $Co_3O_4(111)$ substrate, and an estimate of the O—O surface nearest neighbor distance can be obtained from the line scans, with the reciprocal length from G1 to G2 (FIG. 2b,d) corresponding to 2.5 (±0.1) Å. The O—O nearest neighbor distance is thus estimated at 2.8 (±0.1) Å, in excellent agreement with that obtained for adsorbate-free $Co_3O_4(111)$ films [30]. These data show that the graphene/oxide interface is incommensurate or encompasses a very large unit cell. The LEED data thus indicate that graphene grows on the $Co_3O_4(111)$ substrate without significant in-plane reconstruction of the oxide surface.

Figure 4:
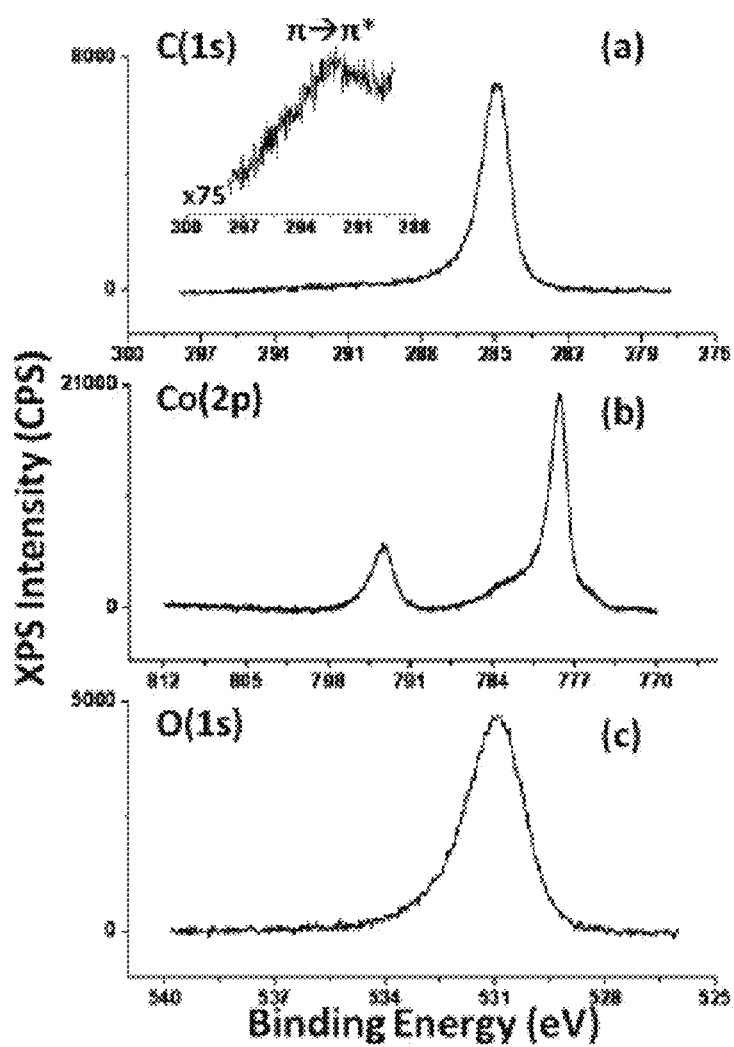
FIG. 4 is (a) C(1s), (b) Co(2p) and (c) O(1s) XPS spectra for a 3 ML graphene film on $Co_3O_4(111)$. The magnified portion of the C(1s) spectrum (a, inset) near 291 eV binding energy indicates the presence of a π,π* shakeup feature.

In FIG. 4 the C(1s) spectrum (FIG. 4a) shows an asymmetric main feature characteristic of graphene [13]. Referencing the spectrometer energy scale to the Al(2p) binding energy of 74.4 eV, characteristic of bulk sapphire [34], yields a $Co_{(2p3/2)}$ peak maximum binding energy of 778.3 (±0.1) eV (FIG. 4b), in excellent agreement with literature values for both bulk and thin film Co [35]. A shoulder at higher binding energies (FIG. 4b) is also consistent with the formation of $Co_3O_4$ [36], and the intensity ratio of the $Co_{(2p3/2)}$ oxide and metal features indicates an oxide thickness of 3 ML. The O(1s) peak maximum is at 530.9 (±0.1) eV, consistent with O(1s) spectra from both bulk sapphire [35] and $Co_3O_4(111)$ thin films [36], with a small shoulder at higher binding energy suggesting some hydroxylation. The C(1s) main peak binding energy (FIG. 4a) is at 284.9 (±0.1) eV, substantially higher than the 284.5 eV binding energy commonly reported for bulk graphite, but similar to the 284.7 eV binding energy reported for monolayer graphene grown by graphitization of SiC(0001) [37], and indicating charge transfer from graphene to the oxide substrate.

Figure 5:
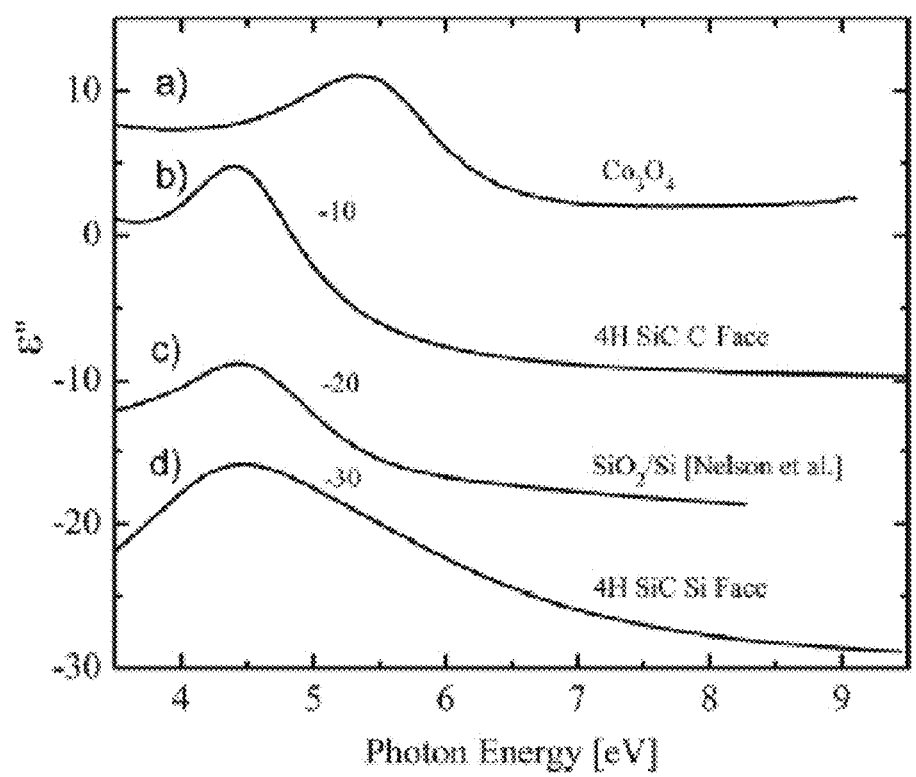
FIG. 5 is the imaginary part of the dielectric optical response function for the 3 ML graphene/$Co_3O_4(111)$/Co (0001) system as interpreted directly from data (a). This is compared to the pure dielectric response of graphene sublimated from 4H-silicon carbide, on the carbon face (b), and on the silicon face (d); and graphene transferred to $SiO_2$ (c), adapted from ref. 40. Negative numbers for (b-d) are the vertical offsets of the data.
Figure 6:
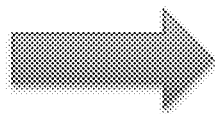
FIG. 6 illustrates the process of the invention in conventional flowchart format. Thus, the process begins with the formation of a metal layer, which in the second step is annealed in an oxygen atmosphere to form a metal oxide surface on the metal. Thereafter, in the third step of the process claimed a layer of macroscopically continuous graphene is formed on the surface of the metal oxide.
Figure 6:
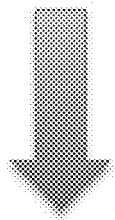

FIG. 5 displays the experimental imaginary part of the dielectric response function for the 3 ML graphene/$Co_3O_4$ (111)/Co(0001) sample. The feature with a maximum near 5.5 eV (FIG. 4, $Co_3O_4$) attributed to both a it to ir* transition and it plasmon excitation [38], is comparable to but blue-shifted with respect to features in the dielectric function reported for graphene physically transferred to $SiO_2$ [24, 39, 40] and for graphene grown on Si substrates [24, 38]. These energies have been shown to be somewhat dependent on both the graphene substrate [24] and number of graphene layers [38]. We suggest, however, that the observed blue shift (FIG. 5) is consistent with the significant graphene-to-oxide charge transfer deduced from the XPS C(1s) binding energy (FIG. 4). The spectroscopy ellipsometry data confirm that the dielectric response of the graphene film and $CO_3O_4$ system are similar to few-layer graphene films grown on SiC(0001) or transferred to $SiO_2$.

DETAILED DESCRIPTION OF THE INVENTION

Direct graphene growth by chemical or physical vapor deposition has been reported on monolayer h-BN(0001)/Ru (0001) [17] and bulk MgO(111) single crystals [18] at or below 1000 K. In both cases, however, strong substrate/graphene interactions, consistent with commensurate graphene/substrate interfaces [17, 19], result in pronounced substrate-induced modification of the graphene electronic structure [18, 20]. Recently, the growth of continuous graphene layers by chemical vapor deposition on $Al_2O_3(0001)$ has been reported [21], but with growth temperatures >1800 K required for films with few defects. The growth temperature reported here, 1000 K, is fully compatible with Si CMOS front end processing, and is significantly lower than that previously reported (~1300 K) [12, 13] for MBE growth on SiC(0001). Other suitable device substrates can be employed at the temperatures employed herein, such as Germania, gallium arsenide and indium.

Growth studies were carried out in a chamber equipped for Auger electron spectroscopy and reverse-view low energy electron diffraction (LEED) I(V) measurements, as described previously [17], but with the addition of a commercial multi-target electron beam evaporator for MBE. Co and graphite rod sources were used, and chamber pressure during deposition was <1×10$^{-8}$ Torr. The intensities of LEED diffraction spots were determined using commercial imaging software, as described previously [18], and by plotting I(V) intensity curves. X-ray photoemission (XPS) spectra were acquired in a separate system [22] with a hemispherical analyzer in constant pass energy mode (23.5 eV), using an unmonochromatized Al $K_\alpha$ x-ray source operated at 15 kV, 300 W. Spectroscopic ellipsometry data were acquired and analyzed by methods described previously [23, 24] using recent optical data of $_{Co3O4}$ [25]. Micro-Raman spectra were acquired at two separate spots ~200 nm in diameter, physically separated by a distance of ~3 mm, using a 514 nm excitation source. Identical spectra (see supplemental information) were observed at each location, indicating that the film is uniform over macroscopic distances, with G/2D intensities consistent with multilayer graphene.

Co films were deposited onto commercially available 1 cm$^2$ $Al_2O_3(0001)$ substrates at 750 K, with estimated Co thicknesses >40 Å, as determined by Auger spectroscopy. These films yielded well-defined LEED images characteristic of Co(111) [26]. Subsequent annealing resulted in the surface segregation of dissolved oxygen and the evolution of a ~3 monolayer (ML) Co oxide film with LEED pattern identical to that of few-layer $Co_3O_4(111)$ [27]. Graphene films were subsequently grown at 1000 K by carbon MBE.

An estimate of the graphene domain size (R) can be obtained from the FWHM of the graphene diffraction peaks (FIG. 2), according to [31]

$$R = \frac{b\lambda}{2(1 + \Delta E/E)\beta s} \quad (1)$$

In (1), b is the fidelity factor, generally estimated at 0.35, λ is the electron wavelength (1.52 Å), and (ΔE/E) is the energy spread for the electron gun, estimated at ~0.015. $\beta_s$ is the angular divergence estimated from LEED diffraction beams (e.g., G1, FIG. 2b), normalized to the sample-screen distance (~150 mm). These data yield an estimate of a typical domain size of ~1800 Å, roughly comparable to HOPG [32].

Figure 3:
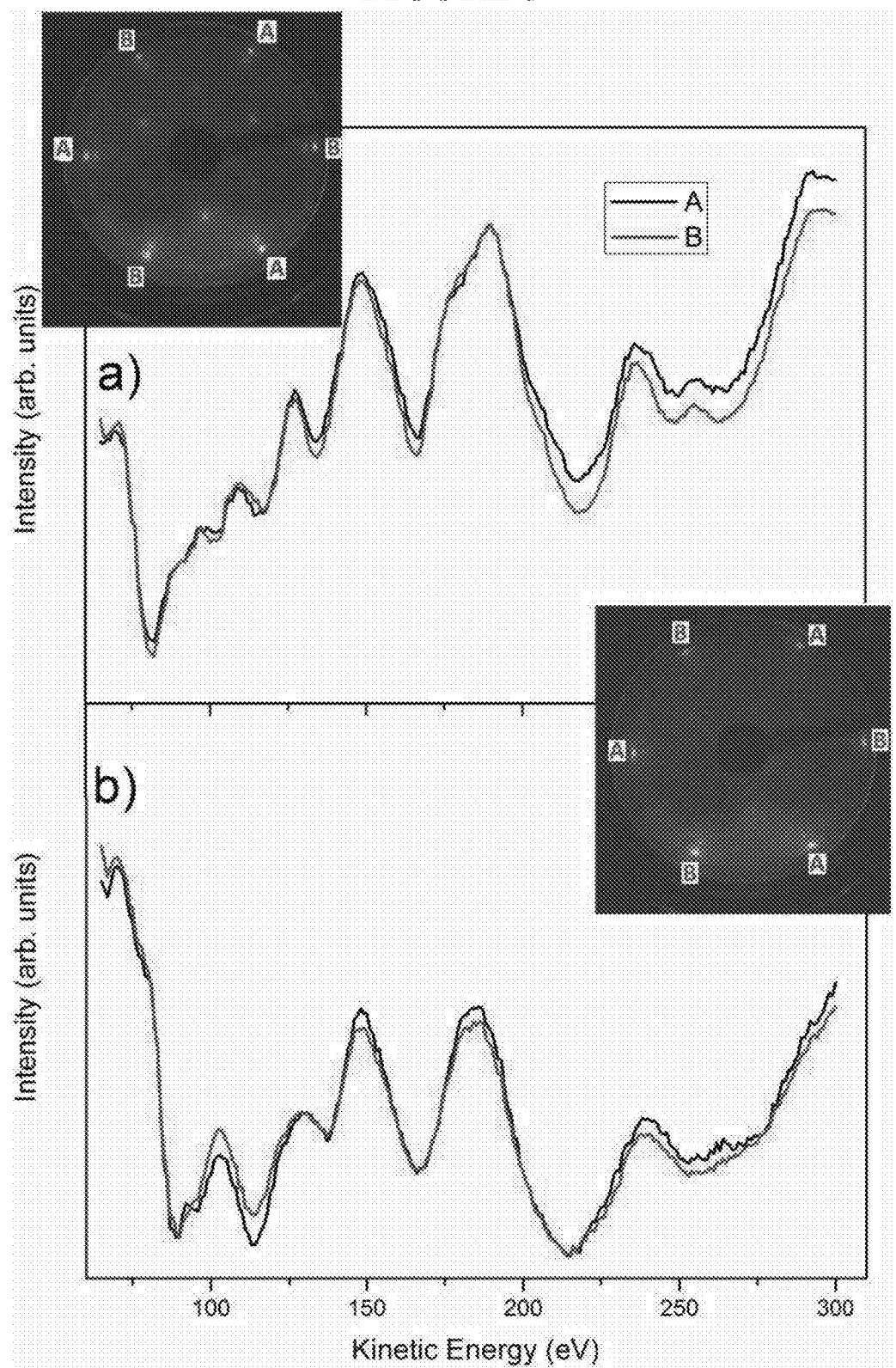
FIG. 3 is (a) Variation in averaged LEED spot intensities for A site diffraction spots (dark trace) and B site spots (light trace) as a function of electron beam energy at 0.4 ML graphene coverage. Inset shows labeling of A site and B site spots in the diffraction pattern; (b) corresponding data at 3 ML coverage, with inset showing labeling of A site and B site spots in the diffraction pattern.

The LEED data in FIG. 2d might indicate unequal intensities for G1 and G2, which is consistent with a transition to 3-fold symmetry, but which can also be induced by spurious experimental effects. In order to determine whether the graphene overlayers exhibited true six-fold symmetry and graphene lattice A site/B site chemical equivalence, the average integrated intensities of A site and B site diffraction spots are plotted as a function of beam voltage (I(V) curves) in FIG. 3, at both 0.4 ML (FIG. 3a) and 3.0 ML (FIG. 3b) average graphene coverage. The data show very similar I(V) curves for averaged A site and B site intensities at both low and high coverages, indicating the persistence of $C_{3v}$ LEED symmetry from 0.4 ML to 3 ML graphene coverage. $_{C6v}$ symmetry was also observed for LEED features at 1 ML (not shown). The sharpness of the features, and the existence of different maxima and minima at 0.4 ML (FIG. 3a) than at 3.0 ML (FIG. 3b), especially in the surface sensitive region <150 eV electron beam energy, also support the possibility of layer-by-layer growth, since island formation would result in the simultaneous existence of regions of low and high coverage, with the resulting I(V) curve being the average of I(V) curves characteristic of each coverage. The Auger electron spectroscopy and LEED data (FIGS. 1-3) indicate the controlled growth of multilayer graphene—to an average thickness of at least 3 ML—with the exhibition of $_{C6v}$ LEED symmetry at both low and high graphene coverages.

The same conclusion was reached after the evaluation of average A site and B site intensities using commercial imaging software. Six-fold symmetry is expected for graphene in contact with an incommensurate substrate, as both graphene A sites and B sites will experience an ensemble of substrate environments. In contrast, $C_{3v}$ symmetry may be expected for multilayers, if the layers exhibit Bernal stacking (A-B-A) and the graphene layer is single domain. A more detailed analysis of the LEED data, including dynamical scattering analysis, is required for further elucidation of the structural details.

Following the acquisition of Auger electron spectra and LEED data, the sample was exposed to ambient, and then re-inserted into UHV. Subsequently acquired Auger electron spectra and LEED data showed no change from those in FIG. 1a (solid line) and FIG. 2c, respectively, indicating that the sample was inert to ambient exposure. This effect has been observed for other reactive surfaces covered with graphene layers [17, 18, 20, 26, 33] and indicates that the graphene multilayers form a macroscopically continuous film shielding the 3 ML $Co_3O_4$(111)/Co(0001) film from reaction with ambient. The XPS spectra of the 3 ML graphene film on $Co_3O_4$(111)/Co(0001) substrate are shown in FIG. 4.

While the present invention has been disclosed with references to certain embodiments, numerous modification, alterations, and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof.

REFERENCES

[1] Novoselov K S, Geim A K, Morozov S V, Jiang D, Zhang Y, Dubonos S V, Grigorieva I V, Firsov A A. 2004 *Science*. 306 666.

[2] Novoselov K S, Geim A K, Morozov S V, Jian D, Katsnelson M I, Grigorieva I V, Dubonos S V. Firsov A A. 2005 *Nature*. 438 197.

[3] Neto A H C., Guineau F, Peres N M R, Noveoselov K S. Geim A K. 2009 *Rev. Mod, Phys.* 81 109.

[4] Haugen H, Huertas-Hernando D, Brataas A. 2008 *Phys. Rev, B.* 77 115406.

[5] Tombros N, Jozsa C, Popinciuc M, Jonkman H T, van Wees B J. 2007 *Nature*. 448 571.

[6] Li X. Cai W, An J, Kim S, Nah J, Yang D, Piner R. Velamakanni A, Jung I, Tutuc E, Banerjee S K, Colobmo L, Ruoff R S. 2009 *Science*. 324 1312.

[7] Reina A, Thiele 5, Jia X, Bhaviripudi S, Dresselhaus M S, Schaefer J A, Kong J. 2009 *Nano. Res.* 2 509.

[8] Berger C, Song Z, Li T, Li Z. Ogbazghi A Y, Feng R. Dai Z, Marchenkov A N, Conrad, E H, First, P N, de Heer W A. 2004 *J. Phys. Chem. B.* 108 19912.

[9] Berger C, Spong Z, Li X, Wu X, Brown N, Naud C, Mayou D, Li T, Hass J, Marchenkov A N., Conrad E H, First P N, de Heer W A. 2006 *Science*. 312 1191.

[10] Forbeaux I, Themlin J-M, Debever J-M. 1998 *Phys. Rev. B* 58 16396.

[11] Zhang Y, Brar V W, Girit C, Zettl A, Crommie M F. 2009 *Nature Phys.* 5 722.

[12] Park J, Mitchel W C, Grazulis L, Smith H E, Eyink K G, Boeckl J J, Tomich D H, Pacley S D, Hoelscher J E. 2010 *Adv Mat.* 22 4140.

[13] Moreau E, Ferrer F J, Vignaud D, Godey S, Wallart X. 2010 *Phys. Stat. Solidi A*. 207 300.

[14] Zheng Y, Ni G, Toh C, Zeng M, Chen S, Yao K, Ozyilmaz B. 2009 *Appl. Phys. Lett.* 94 163505.

[15] Imam S A, Deshpande T, Guermune A, Siaj M, Szkopek T. 2011 *Appl. Phys Lett.* 99 082109.

[16] Michetti P, Recher P, Iannaccone G. 2010 *Nano Lett.* 10 4463.

[17] Bjelkevig C, Mi Z, Xiao J, Dowben P A, Wang L, Mei W, Kelber J A. 2010 *J. Phys: Cond. Matt.* 22 302002.

[18] Gaddam S, Bjelkevig C, Ge S, Fukutani K, Dowben P A, Kelber J A. 2011 *J. Phy.: Cond Matt.* 23 072204.

[19] Kelber J A, Gaddam S, Vamala C, Eswaran S, Dowben P A. 2011 *Proc. SPIE* 8100 81000Y-1.

[20] Kong L, Bjelkevig C, Gaddam S. Zhou M, Lee Y H, Han G H, Jeong H K, Wu N, Zhang Z, Xiao J, Dowben P A, Kelber J A. 2010 *J. Phys. Chem. C.* 114 21618.

[21] Fanton, M A. Robinson, J A, Weiland, B E, Labella, M. Trumbel K, Kasarda, R., Howsare, C, Hollander M, Snyder D W. 2011 "Catalytic Free Synthesis of High Mobility Graphene on Sapphire" *Abstract for 'Graphene 2011'* (Bilbao, Spain, April 11-14) (obtained from www-.phantomsnet.net).

[22] Bjelkevig C, Kelber J. 2009 *Electrochim Acta.* 54 3892.

[23] Hofmann T. Boosalis A, Kuhne P. Herzinger C M, Woollam J A. Gaskill D K, Tedesco J L, Schubert M. 2011 *Appl. Phys. Lett.* 98 041906.

[24] Boosalis, A., Hofmann, T., Schoche, S., Dowben, P., Gaddam, S., Vamala, C., Kelber, J., Darakchieva, V., Yakimova, R., Nyakiti, L. O., Wheeler, V. D., Myers-Ward, R. L., Eddy Jr., C. R., Gaskil, D. K., Schubert, M. "Optical properties of graphene on SiC polytypes determined by spectroscopic ellipsometry from terahertz to the VUV". 2011 *Conference Abstract, Nano DDS* (Brooklyn, N.Y. August 29).

[25] Donders M E, Knoops H C M, van de Sanden, M C M, Kessels W M M, Notten P H L. 2011 *J Electrochem Soc.* 158 G92.

[26] Ago H, Ito Y, Mizuta N, Yoshida K, Hu B, Orofeo C M, Tsuji M, Ikeda K, Mizuno S. 2010 *ACS Nano.* 4 7407.

[27] Vaz C A F, Prabhakaran D, Altman E I, Henrich V E. 2009 *Phys. Rev. B.* 80 155457.

[28] Viljoen P E, Roos W D, Swart H C, Holloway P H. 1996 *Appl. Surf. Sci.* 100/101 612.

[29] Argile C, Rhead G E. 1989 *Surf Sci Rep.* 10 277.

[30] Meyer W, Biedermann K, Gubo M, Hammer L, Heinz K. 2008 *J. Phys.: Cond. Matt.* 20 265011.

[31] Ertl G, Kuppers J. 1974 Low energy electrons and surface chemistry (Verlag-Chemie, Weinheim, FRG) 159.

[32] Lu X, Yu M, Huang H, Ruoff R S. 1999 *Nanotechnol.* 10 269.

[33] Dedkov Y S., Fonin M, Rudiger U, Laubschat C. 2008 *Phys. Re.v Lett.* 100 107602.

[34] Moulder J F, Stickle W F, Sobol P E, Bomben K D. 1995 Handbook of X-ray photoelectron spectroscopy (Physical Electronics, Eden Prairie, Minn., USA).

[35] Chambers S A., Droubay T, Jennision D R, Mattson T R. 2002 *Science*. 297 837.

[36] Petito S C., Langell M A. 2004 *J. Vac. Sci. and Technol. A.* 22 1690.

[37] Emtsev K V, Speck F, Seyller T, Ley L. 2008 *Phys. Rev. B.* 77 155303.

[38] Santoso I, Gogoi P K, Su H B, Huang H, Lu Y, Qi D, Chen W. Majidi M A, Feng Y P, Wee A T S, Loh K P, Venkatesan T, Saichu R P, Goos A, Kotlov A, Rubhausen M, Rusydi A. 2011 *Phys. Rev. B.* 081403.

[39] Kravets V G., Grigorenko A N, Nair R R, Blake P, Anissimova S, Novoselov K S, Geim A K. 2010 *Phys Rev B.* 81 155413.

[40] Nelson F J, Kaminenei V K, Zhang T, Comfort E S, Lee J U, Diebold A C. 2010 *Appl. Phys. Lett.* 97 253110.

[41] Lazarov V K, Plass R, Poon H-C, Saldin D K, Weinert M, Chambers S A, Gajdardziska-Josifovska M. 2005 *Phys. Rev. B.* 71 115434.

[42] Röhr F, Wirth K, Libuda J, Cappus D, Baumer M, Freund H-J. 1994 *Surf Sci.* 315 L977.

[43] Cappus D, Xu C, Ehrlich D, Dillmann B, Ventrice Jr. C A, Al Shamery K, Kuhlenbeck H, Freund H-J. 1993 *Chem. Phys.* 177 533.

[44] Goniakowski J, Noguera C. 2002 *Phys. Rev. B.* 66 085417.

What is claimed is:

1. A method of forming a composition of matter comprising macroscopically continuous layers of graphene on a metal oxide surface, wherein said method comprises steps of:

forming a layer of a metal consisting of cobalt and having a first major surface;

annealing said first major surface in oxygen to form an oxide of said metal on said first major surface; and forming more than one layer of macroscopically continuous graphene on said metal oxide layer by carbon molecular beam epitaxy (MBE) thereby creating an oxide/graphene interface between said metal oxide layer and a first layer of graphene, wherein said oxide/graphene interface is incommensurate, without reconstruction of the metal oxide surface, thus yielding $C_{6V}$ symmetry in said first layer of graphene, wherein said step of annealing and said step of forming more than one layer of macroscopically continuous graphene are both conducted at temperatures of not more than one thousand degrees Kelvin.

2. A composition of matter comprising a macroscopically continuous multilayer film of graphene on a magnetically polarizable metal oxide creating a graphene/oxide interface between a surface of said metal oxide and a first layer of graphene, wherein said metal oxide consists of cobalt oxide and is in turn on a room temperature ferromagnet, wherein the graphene/oxide interface is incommensurate, without reconstruction of said metal oxide surface, thus yielding $C_{6V}$ symmetry in said first layer of graphene.

3. The composition of matter of claim 2, wherein said composition of matter comprises a graphene field effect transistor, a coherent spin field effect transistor, a magnetic tunnel junction or switch.

* * * * *